United States Patent
Guidash

(10) Patent No.: US 6,259,124 B1
(45) Date of Patent: *Jul. 10, 2001

(54) ACTIVE PIXEL SENSOR WITH HIGH FILL FACTOR BLOOMING PROTECTION

(75) Inventor: Robert M. Guidash, Rochester, NY (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/130,665

(22) Filed: Aug. 7, 1998

(51) Int. Cl.[7] .................................................. H01L 27/146
(52) U.S. Cl. ........................................... 257/292; 257/291
(58) Field of Search ..................................... 257/291, 292

(56) References Cited

U.S. PATENT DOCUMENTS

| | | | |
|---|---|---|---|
| 5,130,774 | 7/1992 | Stevens et al. | 357/24 |
| 5,306,931 | 4/1994 | Stevens | 257/223 |
| 5,349,215 | 9/1994 | Anagnostopoulos et al. | 257/223 |
| 5,587,596 | * 12/1996 | Chi et al. | 257/292 |
| 5,608,243 | * 3/1997 | Chi et al. | 257/292 |
| 5,614,744 | * 3/1997 | Merrill | 257/292 |
| 5,625,210 | 4/1997 | Lee et al. | 257/292 |
| 5,841,158 | * 11/1998 | Merrill | 257/292 |
| 5,872,371 | * 2/1999 | Guidash et al. | 257/292 |
| 5,903,021 | * 5/1999 | Lee et al. | 257/292 |
| 5,952,686 | * 9/1999 | Chou et al. | 257/292 |

* cited by examiner

*Primary Examiner*—Gene M. Munson
(74) *Attorney, Agent, or Firm*—Peyton C. Watkins

(57) ABSTRACT

A semiconductor based image sensor having a plurality of pixels formed on a surface of the image sensor, such that each of the pixels has a photodetector configured to collect majority carriers created from incident light; a region within each of the photodetectors that is narrowed, the narrowed region of the photodetector being electrically coupled to a drain for the majority carriers; a reset means; a transistor for converting photo-charge to voltage or current. The narrowed region provides a path for excess photoelectrons in the photodetector to the drain. The narrow regions path to the drain, in the preferred embodiment, is that of the drain used for the adjacent transistor.

14 Claims, 8 Drawing Sheets

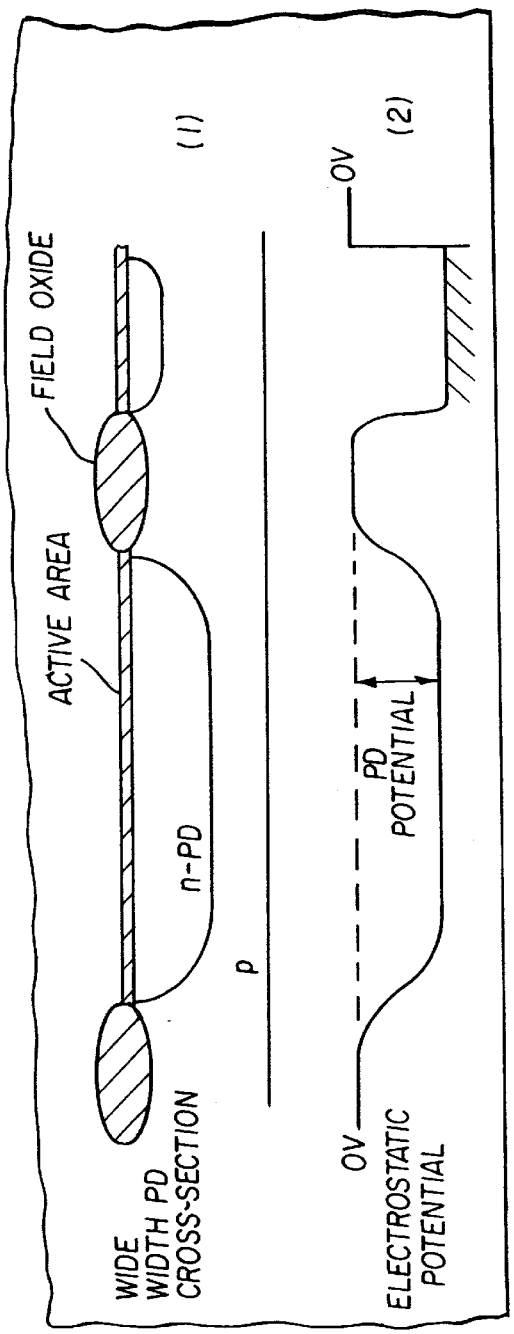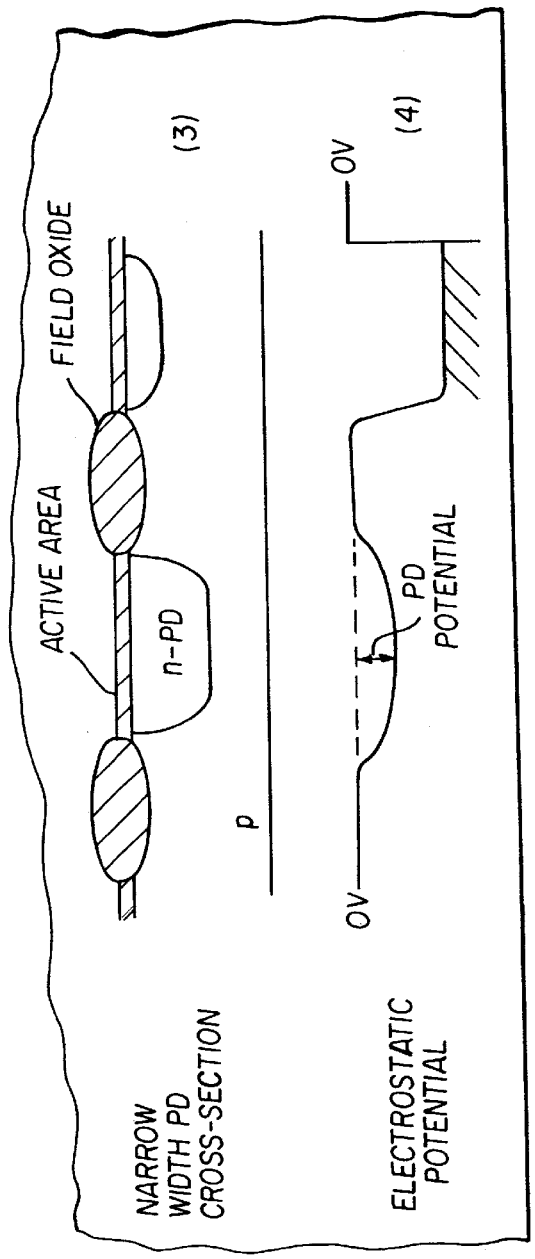
FIG. 3a
FIG. 3b

ACTIVE PIXEL SENSOR WITH HIGH FILL FACTOR BLOOMING PROTECTION

FIELD OF THE INVENTION

This invention relates to the field of solid state photosensors and imagers, and more specifically to imagers referred to as Active Pixel Sensors, (APS).

BACKGROUND OF THE INVENTION

APS are solid state imagers where each pixel contains a photo-sensing means, reset means, a charge transfer means, a charge to voltage conversion means, and all or part of an amplifier. One undesirable phenomenon that can occur with solid state image sensors is referred to as blooming. This occurs when an extremely bright region in an image produces excess photoelectrons that can traverse the isolation regions that surround the photodetector in the pixel in which they were created and end up in other pixels or charge transfer regions within the image sensor and corrupt the photoelectron packet that was created by the irradiance incident upon the other pixels. Prior art APS devices have provided protection against blooming by keeping either the transfer gate and/or reset gate "off-level" electrostatically deeper than zero volts so that if more photoelectrons are generated than that which can be held by the photodetector, the excess photoelectrons can spill over the transfer gate and/or reset gate into the floating diffusion and/or reset supply. This approach has the disadvantage of diminishing the amount of photoelectrons that can be held by the photodetector, and in the case of a transfer gated pixel architecture, does not provide any blooming protection during read out of the sensor. Blooming protection can also be provided by inclusion of a lateral overflow drain (LOD) and lateral overflow gate (LOG) or a vertical overflow drain (VOD) within each pixel. Use of LOD and LOG has the disadvantage of decreasing fill factor. Inclusion of a VOD requires a more complex and thus a higher cost process.

In addition, APS devices have been operated in a manner where each line or row of the imager is reset, integrated and read out at a different time interval than each of the remaining lines or rows. In other words, the image capture for each row is done sequentially with the image capture for each row temporally displaced from every other row, with each row having the same integration time. Hence if one were reading out the entire imager, each line would have captured the scene at a different point in time. Since illumination conditions can and do vary temporally, and since objects in the scene may also be moving, this method of read out can produce line artifacts in the resulting representation of the image. This limits the usefulness of APS devices in applications where high quality motion or still images are required. In U.S. Pat. No. 5,986,297, entitled COLOR ACTIVE PIXEL SENSOR WITH ELECTRONIC SHUTTER, ANTIBLOOMING AND LOW CROSS-TALK, BY Robert M. Guidash, et al., disclosed is a means to mitigate these artifacts by performing frame integration, followed by row at a time readout. Since the readout time in this mode of operation can be as long as 30 msec. for the last row of pixels being read out, it is even more important to provide blooming protection during read out.

From the discussion above, it is evident that there is a need to provide blooming protection during integration and read out that does not adversely affect the fill factor of the pixel.

SUMMARY OF THE INVENTION

The present invention is directed to overcoming one or more of the problems set forth above. It provides a means for blooming protection during integration and read out that does not affect the fill factor of the pixel. Briefly summarized, according to one aspect of the present invention, a semiconductor based image sensor having a plurality of pixels formed on the surface of the image sensor, each of the pixels further comprising: a photodetector configured to collect majority carriers created from incident light; at least one transistor configured to convert photocharge to a voltage or current; a drain for majority carriers; a region in between the photodetector drain that has no separate control gate, the region having an electrostatic potential that is shallower than the photodetectors but deep enough to provide a path for photoelectrons to preferentially flow from the photodetector to the drain.

These and other aspects, objects, features, and advantages of the present invention will be more clearly understood and appreciated from a review of the following detailed description of the preferred embodiments and appended claims, and by reference to the accompanying drawings.

Advantageous Effect of the Invention

The present invention has the advantages of providing blooming protection during both integration and readout, electronic frame integration, and high fill factor.

BRIEF DESCRIPTION OF THE DRAWINGS

FIG. 3a is a diagram illustrating the electrostatic potential within a wide width photodetector section;

FIG. 3b is a diagram illustrating the electrostatic potential within a narrow width photodetector section;

To facilitate understanding, identical reference numerals have been used, where possible, to designate identical elements that are common to the figures.

DETAILED DESCRIPTION OF THE INVENTION

Figure 1A:
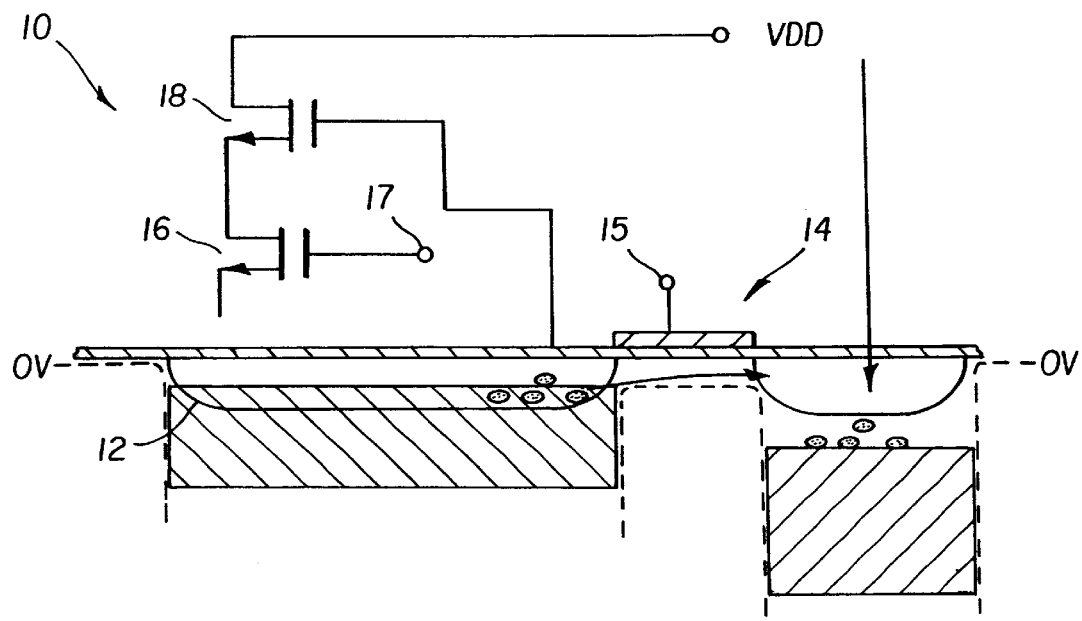
FIG. 1a is a diagram of a prior art pixel.
Figure 1B:
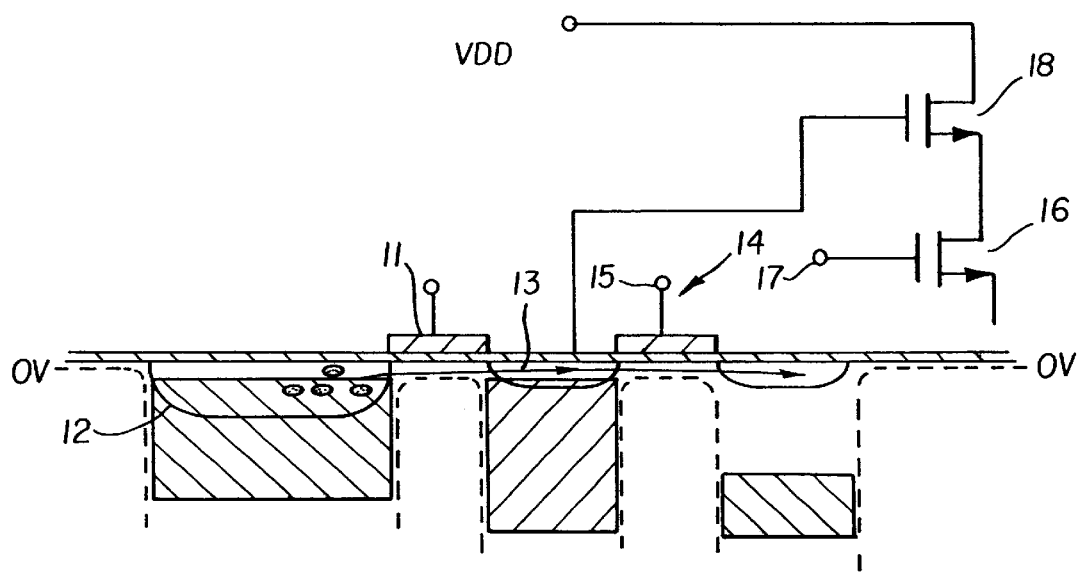
FIG. 1b is another diagram of a prior art pixel.

Typical prior art APS pixels are shown in FIGS. 1a and 1b. The pixel in FIG. 1a comprises a photodetector 12, typically a photodiode (PD), a reset transistor 14 with a reset gate 15 (RG), a row select transistor 16 with a row select gate 17 (RSG), and signal transistor 18 (SIG). Light incident upon the photodetector creates free electrons that are confined to the photodetector by an isolation region, or region, surrounding the photodetector. The isolation regions typically comprise a field oxide region surrounding the photodetector, and a transfer gate or reset gate that when appropriately biased confine photocharge to the photodetector. Blooming protection is to provided by keeping the off-level of the reset gate 15 at an electrostatic potential (the conduction band minima) deeper than zero volts so that excess photoelectrons can flow through the region under the reset gate 15 into VDD, which is a drain for the photoelectrons. This is depicted by inclusion of the electrostatic potential diagram for the pixel cross section. The electrostatic potential is shown by the dotted line in FIG. 1*a*. The electrostatic potential of the isolation regions are typically 0 volts In the pixel design shown in FIG. 1*a*, blooming protection is essentially inherent, but this pixel architecture cannot perform frame integration without use of a mechanical shutter. The pixel in FIG. 1*b* comprises a photodetector 12, that can be either a photodiode or photogate, a transfer gate 11, a floating diffusion 13, a reset transistor 14 with a reset gate 15, a row select transistor 16 with a row select gate 17, and signal transistor 18. Blooming protection can be done in the same manner as described for the pixel in FIG. 1*a*. The transfer gate 11 and reset gate 15 off-levels are kept at an electrostatic potential deeper than zero volts so that excess photoelectrons flow through the region under transfer gate 11 into the floating diffusion 13, through the region under reset gate 15 and into VDD. Once again this is depicted by the dotted line diagram of electrostatic potential for the pixel cross section. This method will provide blooming protection only during integration. It will not provide blooming protection during read out, (i.e. when one is sampling the signal stored on the floating diffusion 13).

Figure 1C:
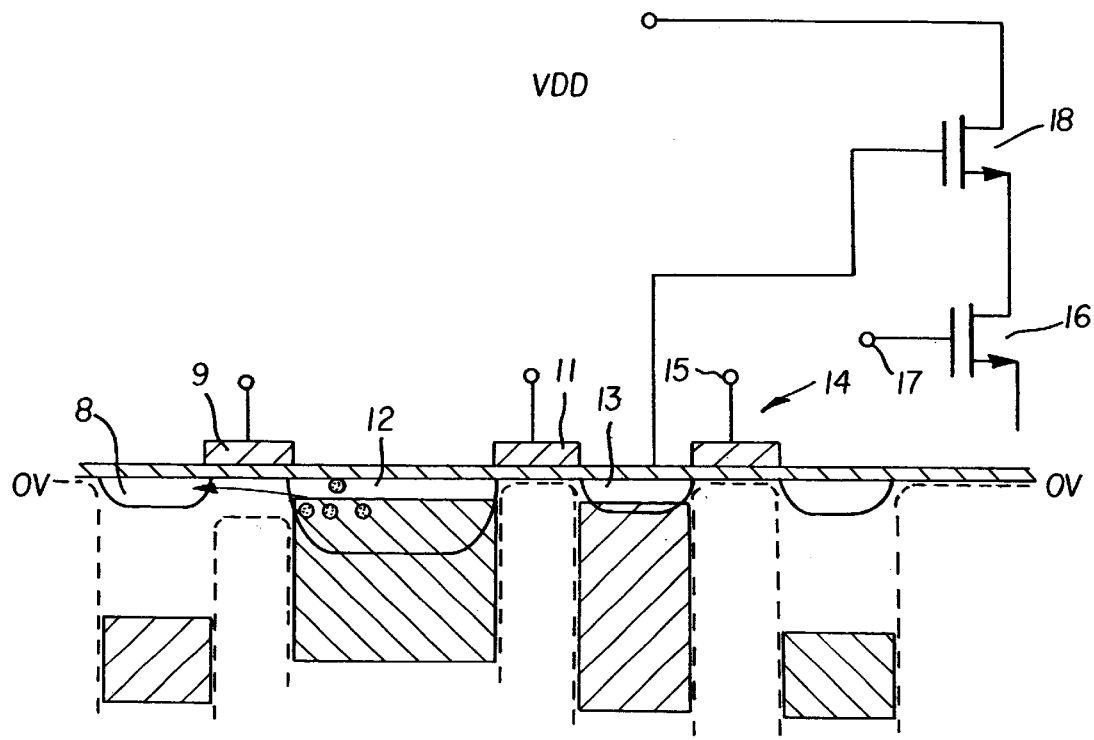
FIG. 1c is another diagram of a prior art pixel.
Figure 1D:
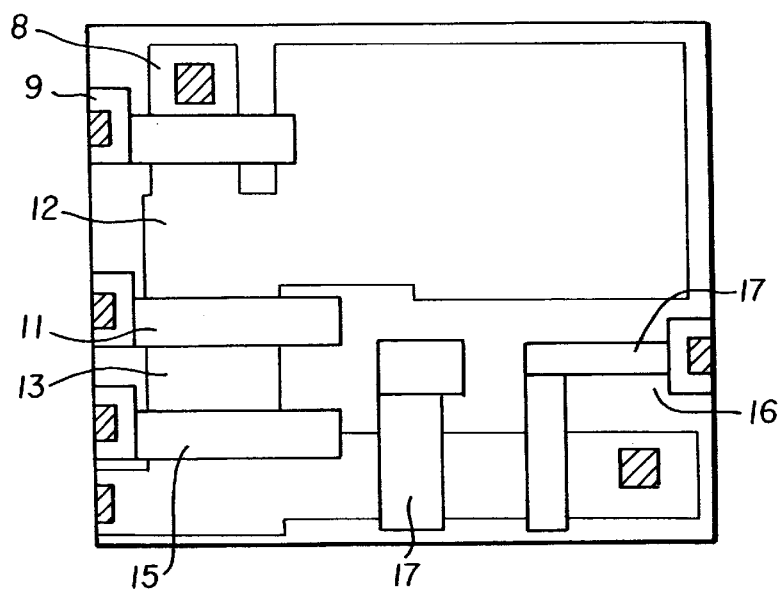
FIG. 1d is top view of the prior art pixel shown in FIG. 1c.

Referring to FIG. 1*c*, the problem discussed above relating to blooming protection during readout is addressed by the inclusion of lateral overflow gate (LOG) 9 and lateral overflow drain (LOD) 8. Now excess photoelectrons can flow through the region under LOG 9 and into the LOD 8 so that the excess photoelectrons cannot corrupt the signal on the floating diffusion 13 during read out. Inclusion of an LOG 9 and LOD 8 within the pixel reduces fill factor leading to inferior sensitivity. This is also shown in top view in FIG. 1*d*.

Figure 2A:
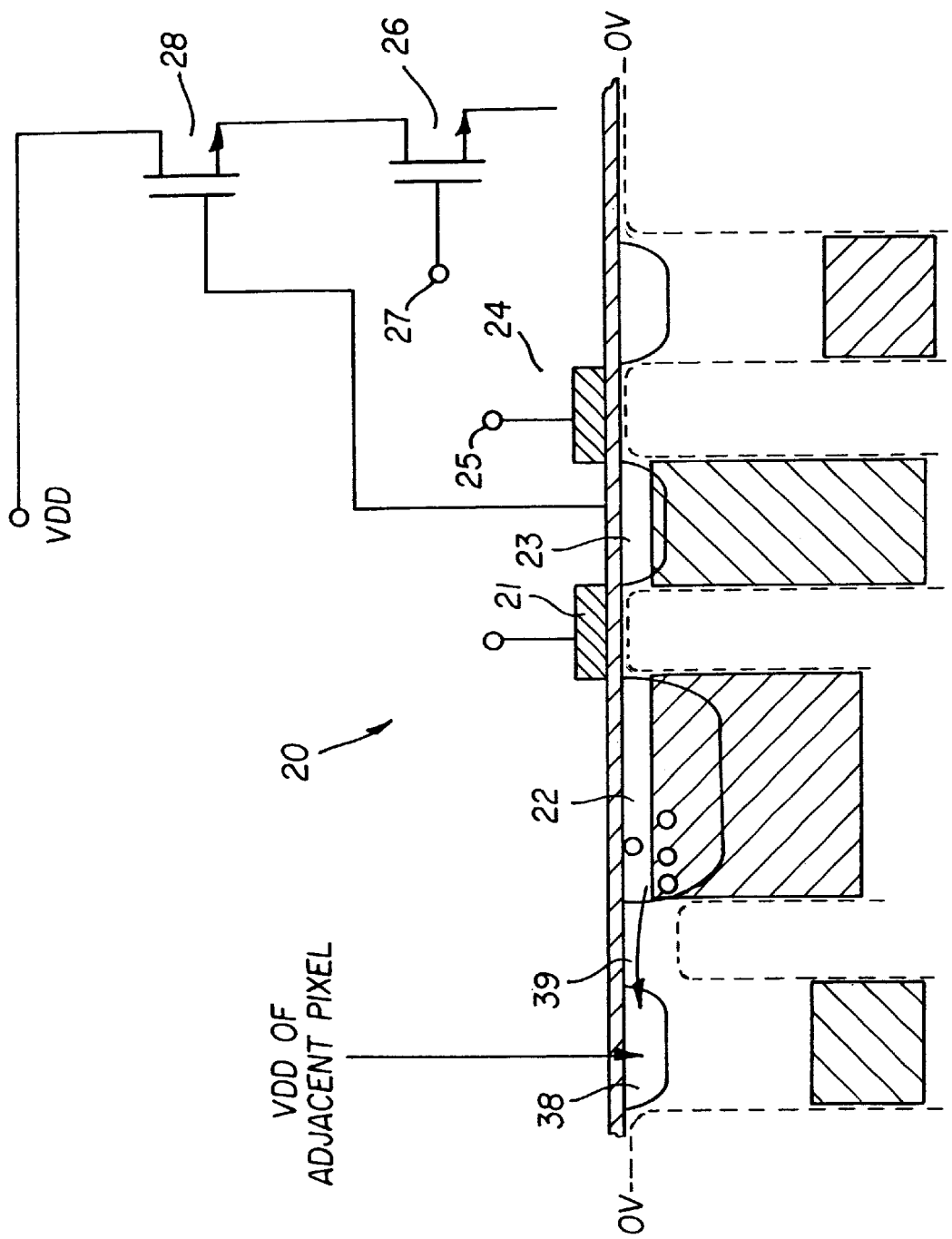
FIG. 2a is a diagram of a pixel as envisioned by the present invention.

This invention provides a means to provide blooming protection during integration and read out, without impacting fill factor, for a pixel architecture that can be used to perform electronic frame integration. Some physical embodiments of the new pixel architecture are shown in FIGS. 2*a* through FIG. 5. While other specific physical embodiments will be realizable, these are chosen for illustration because they represent the most preferred embodiments of the present invention. FIG. 2*a* illustrates a pixel comprising: a photodetector 22 (either a photodiode or a photogate); a transfer gate (TG) 21; a floating diffusion (FD) 23; a reset transistor 24 with a reset gate (RG) 25; a row select transistor 26 with a row select gate (RSG) 27; a signal transistor (SIG) 28; and a lateral overflow region (LOR) 39. It is the LOR 39 that provides a path to reach the VDD of an adjacent pixel 38. The lateral overflow region 39 is realized by using 2-dimensional narrow width effects to provide a region that has an electrostatic potential that is deeper than the off potential used on TG 21, but shallower than the collection potential for photodetector 22. The electrostatic potential is shown by the dotted line for the pixel cross section provided in FIG. 2*a*. The LOR 39 is placed between the photodetector 22 and a VDD 38 for an adjacent pixel. It is envisioned that the, VDD of the pixel itself can be used to remove charge from photodetector 12, however, for the purposes of a preferred embodiment, the best mode takes into account the overall architectural design of the image sensor. Accordingly, issues such as fill factor dictate that it is preferred that VDD 38 be the drain VDD of another pixel, or pixels.

Figure 2B:
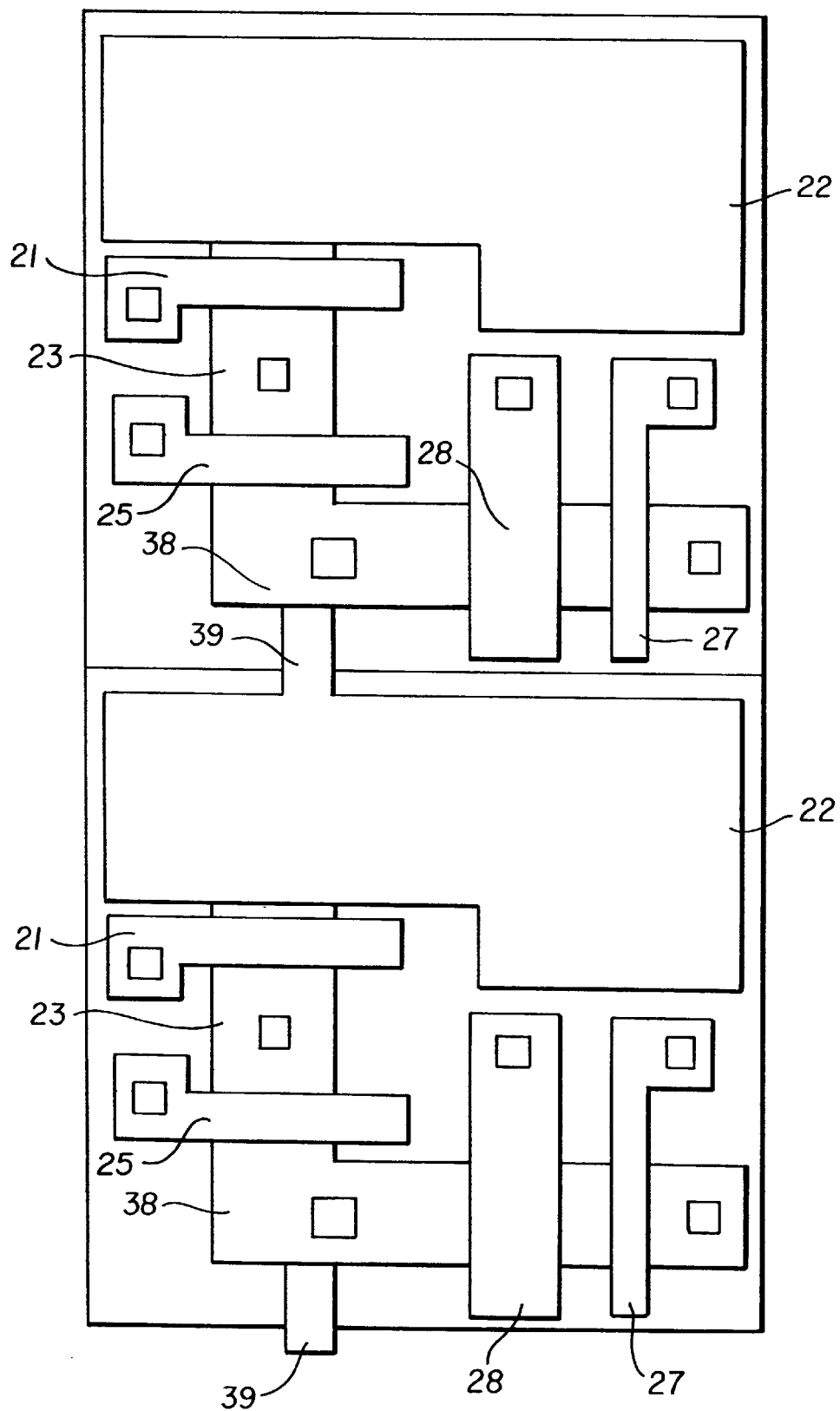
FIG. 2b is a top view of a pixel architecture as envisioned by the present invention

The LOR 39 can be formed in various ways. A top view of one method is shown in FIG. 2*b*. In this case the active area region and implants or diffusions used to form the photodetector 22, are used to create a narrow region for the LOR 39 that is essentially the same as the photodetector 22 only significantly narrower and situated between the photodetector and a VDD region 38.

Figure 3C:
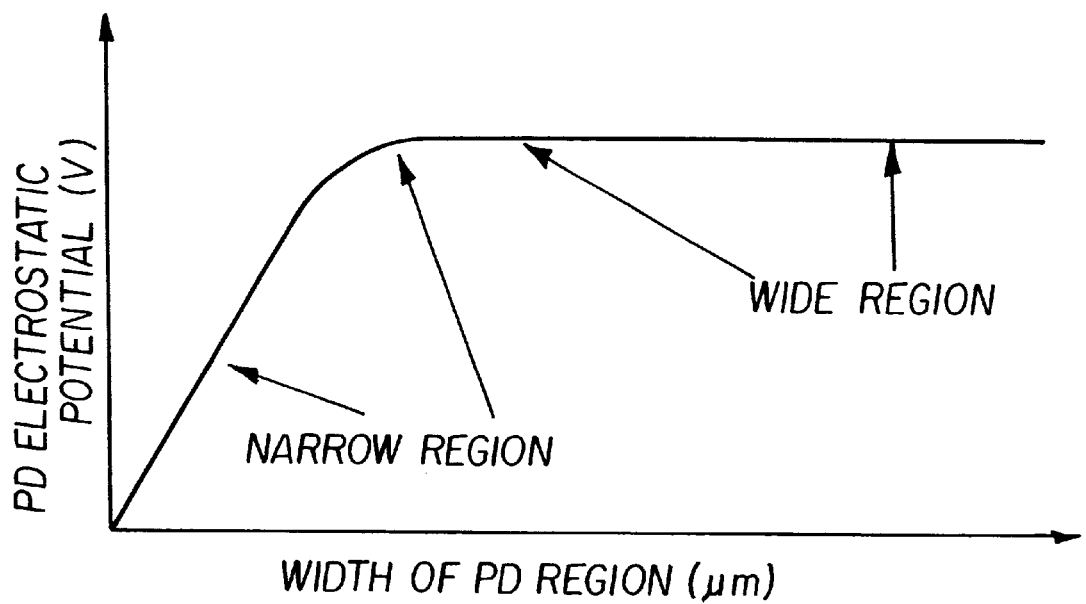
FIG. 3c is a diagram comparing the electrostatic potential between wide and narrow regions of a photodetector within a pixel as envisioned by the present invention.

FIGS. 3*a*–3*c* illustrates the electrostatic potential of a narrow vs. wide photodetector region showing how narrow width effects can be used to create a region with an electrostatic potential that is deeper than zero volts but shallower than the photodetector potential. FIG. 3*a* illustrates the electrostatic potential for the wide region used to create the photodetector 22. FIG. 3*b* illustrates the electrostatic potential for the narrow region used to create the LOR 39. Again referring to FIG. 2*a*, as photoelectrons begin to fill the photodetector 22, excess photoelectrons will flow through the LOR 39 and into VDD. The electrostatic potential level of LOR 39 is lower than the electrostatic potential for transfer gate 21 in the off-state, accordingly, excess photoelectrons cannot flow over transfer gate 21 onto the floating diffusion 23 and corrupt the signal level during read out. Since there have been no added components placed within the pixel 20, the fill factor of pixel 20 is left unchanged.

Another means for producing an LOR for a photogate based pixel 40 architecture is shown in FIG. 4. In this case the active area and photogate regions 42 are used to create the LOR 49. A separate p-type implant could also be used in the narrow active area region underneath photogate 42 to make the effective threshold voltage of that region higher than that of the photogate photodetector region. In either case the result is that when photogate 42 is biased in depletion in order to collect photoelectrons, the electrostatic potential of the LOR 49 region is shallower than that of the photogate 42 photodetector region but deeper that that of TG 43 in its off-state.

Figure 4A:
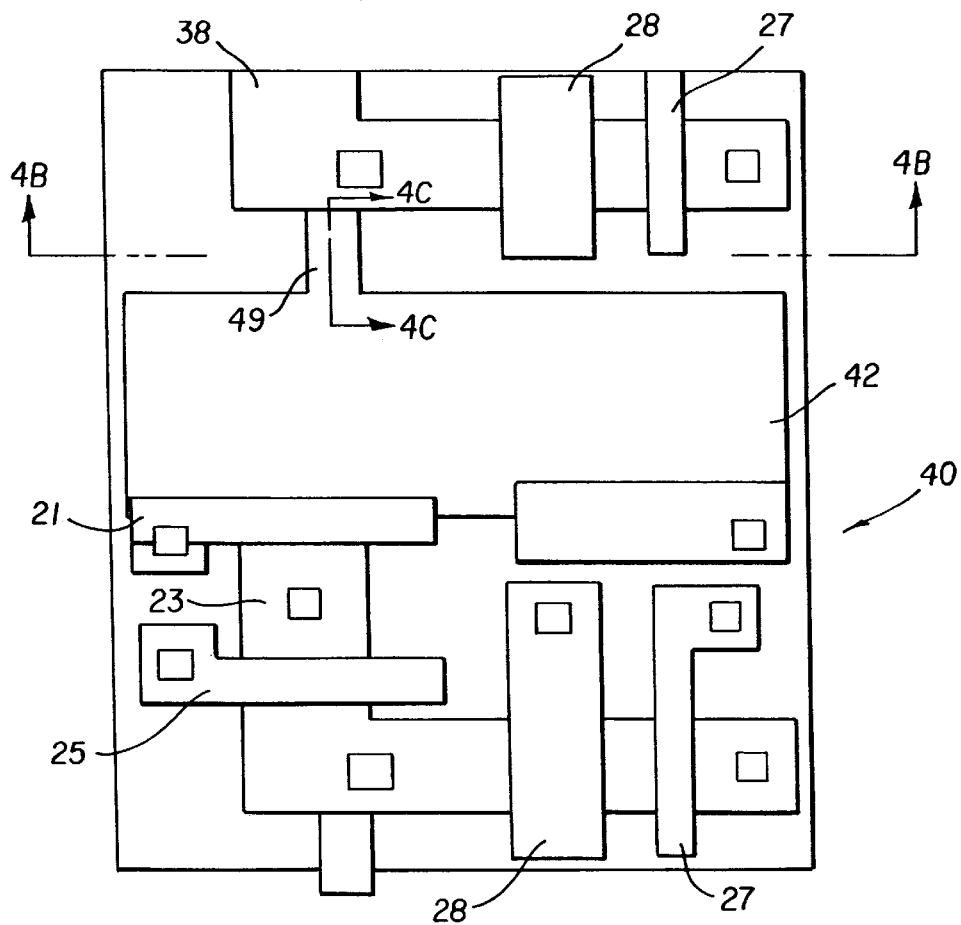
FIG. 4a is a diagram illustrating another embodiment of the lateral overflow region as envisioned by the present invention.
Figure 4B:
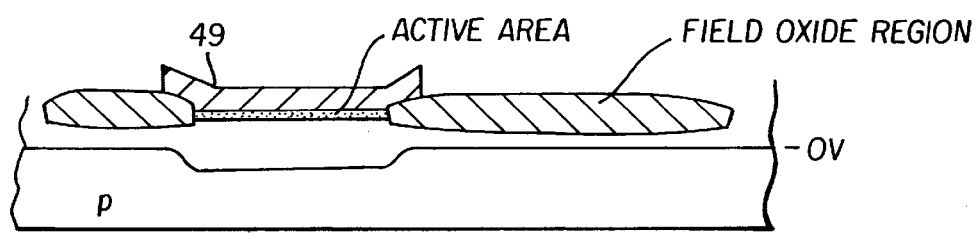
FIG. 4b is a cross sectional diagram along the line AA' of FIG. 4a with a corresponding electrostatic potential diagram.
Figure 4C:
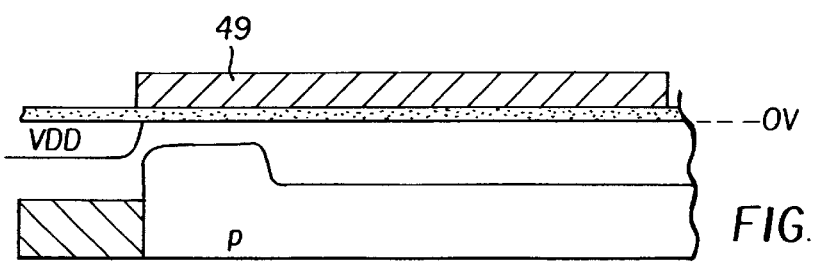
FIG. 4c is a cross sectional diagram along the line BB' of FIG. 4a with a corresponding electrostatic potential diagram.

FIG. 4*b* is a cross sectional diagram along the line AA' of FIG. 4*a* with a corresponding electrostatic potential diagram that illustrates the electrostatic potential of LOR 49 with respect to VDD and the photogate 42. FIG. 4*c* is a cross sectional diagram along the line BB' of FIG. 4*a* with a corresponding electrostatic potential diagram illustrating the electrostatic potential of the LOR 49 with respect to the field oxide region on either side of LOR 49. The electrostatic potentials is represented by the dotted lines in FIGS. 4*a* and 4*b* and the overall operation is similar to that described for FIGS. 2*a* and 2*b*.

Figure 5A:
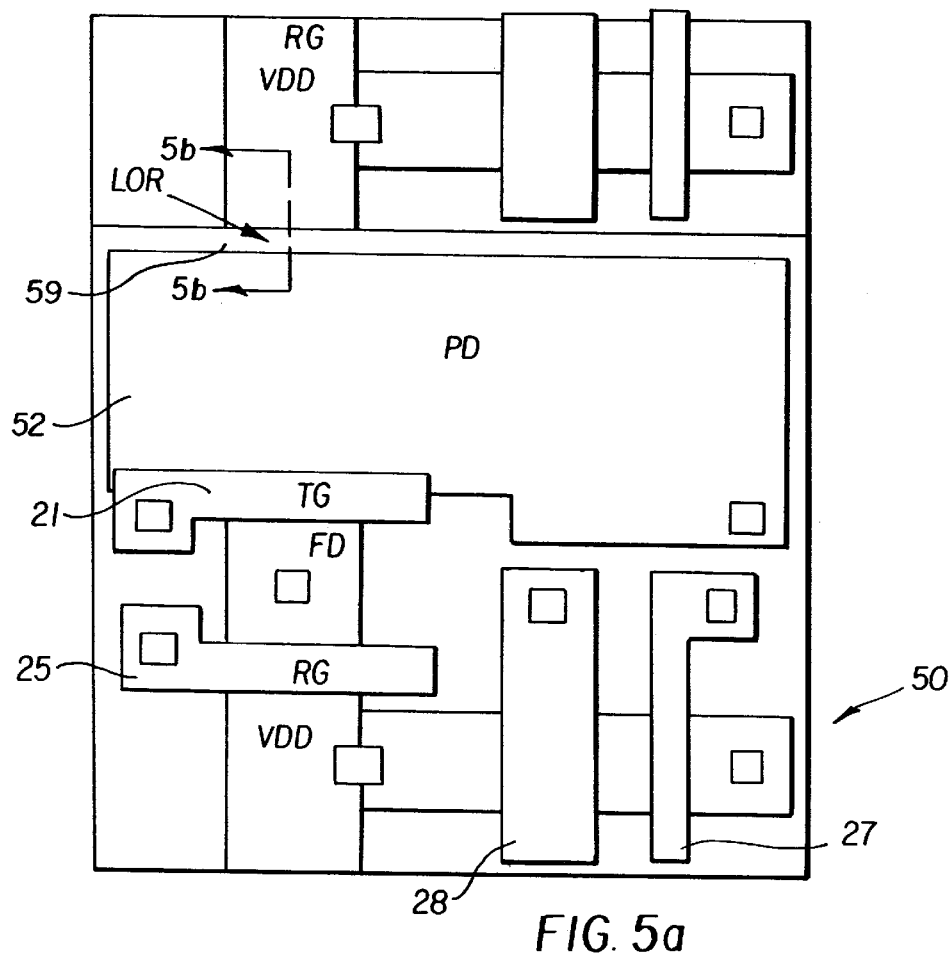
FIGS. 5a and 5b are diagrams illustrating another embodiment of the lateral overflow region as envisioned by the present invention with a corresponding electrostatic potential diagram.
Figure 5B:
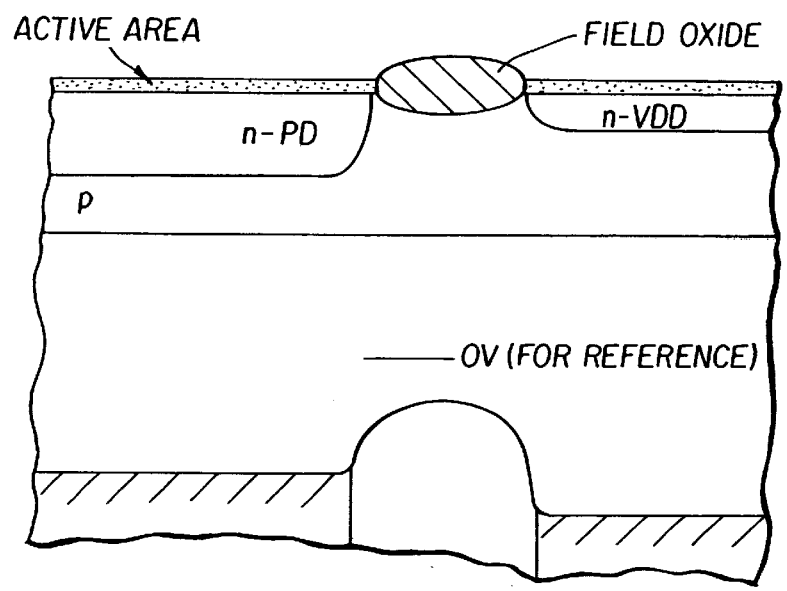

In addition to using narrow active area regions and implants to create the LOR, a narrow field oxide region can be used. This is seen in pixel 50 as shown in FIG. 5. By making the field oxide region in between the photodetector 52 and VDD of the adjacent pixel narrow, the depletion regions from the photodetector and VDD begin to merge. As a result the electrostatic potential of the field region is pulled deeper than 0 volts. By properly designing the width of this narrow field oxide region 59, its electrostatic potential can be adjusted to be deeper than the off potential of the transfer gate, the reset gate, and the electrostatic potential of the field oxide isolation regions, but shallower than the electrostatic potential of the photodetector. Hence, blooming of photoelectrons is prevented. Operation is similar to that already described.

Another method for forming an LOR is envisioned by selective blocking of the field threshold adjust implant. This implant is used in CMOS processes and comprises a boron field threshold adjust implant. It is typically employed in the field oxide regions to prevent depletion and inversion of the field oxide region. This implant can be selectively blocked in a narrow region in between the photodetector and VDD to create a LOR.

The foregoing description of the preferred embodiments has detailed the best modes envisioned by the inventor, obvious variations will be readily apparent to those skilled in the relevant art, accordingly, the scope of the present invention should be measured by the appended claims.

Parts List 8 lateral overflow drain
9 lateral overflow gate
10 pixel
11 transfer gate
12 photodetector
13 floating diffusion
14 reset transistor
15 reset gate
16 row select transistor
17 row select gate
18 signal transistor
20 pixel
21 transfer gate
22 photodetector
23 floating diffusion
24 reset transistor
25 reset gate
26 row select transistor
27 row select gate
28 signal transistor
38 VDD used as a drain for LOR
39 lateral overflow region (LOR)
40 pixel
42 photogate
49 Lateral overflow region
50 pixel
52 photodetector
59 narrow field oxide region
VDD Drain of majority carriers (power source)

What is claimed is:

1. A semiconductor based image sensor having a plurality of pixels formed on the surface of the image sensor, at least one of the pixels further comprising:
a photodetector configured to collect majority carriers created from incident light;
reset means for removing majority charge carriers from the photodetector;
a transistor capable of converting photo-charge to either voltage or current; and
a narrowed region within the photodetector, the narrowed region of the photodetector extending between a wider region of the photodetector and an electrical node for removing the majority carriers, wherein the electrical node for removing majority carriers and the photodetector are within different pixels.

2. The image sensor of claim 1 further wherein the reset means further comprises punch through reset means for draining majority charge carriers from the photodetector.

3. The image sensor of claim 1 wherein the reset means further comprises a coupling to the electrical node for removing majority carriers.

4. The image sensor of claim 1 further comprising a photo charge sense node that is operatively coupled to the photodetector and electrically connected as an input to the transistor.

5. The image sensor of claim 4 further comprising a transfer gate used to operatively couple the photodetector to the sense node.

6. A semiconductor based image sensor having a plurality of pixels formed on the surface of the image sensor, at least one of the pixels further comprising:
a photodetector configured to collect majority carriers created from incident light;
an isolation region around the photodetector that confines stored photocharge within that photodetector;
reset means for removing majority charge carriers from the photodetector;
a transistor coupled to the photodetector and capable of converting photo-charge to either voltage or current; and
a second isolation region extending between the photodetector and a drain node for majority carriers, the region having a doping level and a width that inherently creates an electrostatic potential that is deeper than the off potential of the reset gate and shallower than the electrostatic potential of the photodetector after the photodetector has been reset, wherein the drain node for removing majority carriers and the photodetector are within different pixels;
whereby charge integrated within the photodetector that is in excess of the electrostatic potential of the region is removed to the drain node.

7. The sensor of claim 6 further comprising a transfer gate adjacent to the photodetecotr on a first side of the transfer gate and a sense node adjacent a second side of the transfer gate, wherein, the coupling to the transistor is provided by the transfer gate and the sense node.

8. The sensor of claim 7 wherein the isolation region further comprises a field oxide region surrounding the photodetector in conjunction with the transfer gate.

9. The sensor of claim 6 wherein the isolation region further comprises a field oxide region surrounding the photodetector.

10. The image sensor of claim 6 further wherein the reset means further comprises punch through reset means for draining majority charge carriers from the photodetector.

11. The image sensor of claim 6 wherein the reset means further comprises a coupling to a second drain node for removing majority carriers.

12. The image sensor of claim 11 wherein the coupling further comprises the reset gate formed adjacent to the second drain node to remove majority carriers from the photodetector.

13. The image sensor of claim 6 further comprising a photo charge sense node that is operatively coupled to the photodetector and electrically connected as an input to the transistor.

14. The image sensor of claim 13 further comprising a transfer gate used to operatively couple the photodetector to the sense node.

* * * * *